United States Patent [19]

Tatebayashi

[11] Patent Number: 5,514,957
[45] Date of Patent: May 7, 1996

[54] POSITIONING IN MAGNETIC RESONANCE IMAGING

[75] Inventor: Isao Tatebayashi, Otawara, Japan

[73] Assignee: Kabushiki Kaisha Toshiba, Kanagawa, Japan

[21] Appl. No.: 122,901

[22] Filed: Sep. 16, 1993

[30] Foreign Application Priority Data

Sep. 16, 1992 [JP] Japan ................................. 4-246880
Sep. 14, 1993 [JP] Japan ................................. 5-228840

[51] Int. Cl.⁶ ................................................. G01R 33/20
[52] U.S. Cl. ......................... 324/309; 324/307; 128/653.2
[58] Field of Search ................................. 324/309, 307, 324/300; 128/653.2

[56] References Cited

U.S. PATENT DOCUMENTS

| | | | |
|---|---|---|---|
| 4,884,029 | 11/1989 | Sattin | 324/312 |
| 5,073,752 | 12/1991 | DeMeester et al. | 324/309 |
| 5,138,260 | 8/1992 | Molyneaux et al. | 324/309 |
| 5,322,682 | 6/1994 | Bartzokis et al. | 324/300 |

FOREIGN PATENT DOCUMENTS 60-152942  1/1984  Japan.
2-50732   7/1984  Japan.

*Primary Examiner*—Sandra L. O'Shea
*Assistant Examiner*—Raymond Y. Mah
*Attorney, Agent, or Firm*—Ronald L. Yin; Limbach & Limbach

[57] ABSTRACT

In magnetic resonance imaging, prepared first is a three-dimensional image data consisting of a plurality of tomographic image data of a diagnostic portion of an object being examined. Then, data of a pilot image in the three-dimensional image data are designated, and the pilot image is displayed. Then, a linear ROI (region of interest) is placed on the displayed pilot image. Then, image data of a cross-section are edited from the three-dimensional image data, the cross-section passing through the linear ROI in a space of the three-dimensional image data. On the basis of the edited image data of the cross-section, a prediction image for scan is displayed.

20 Claims, 18 Drawing Sheets

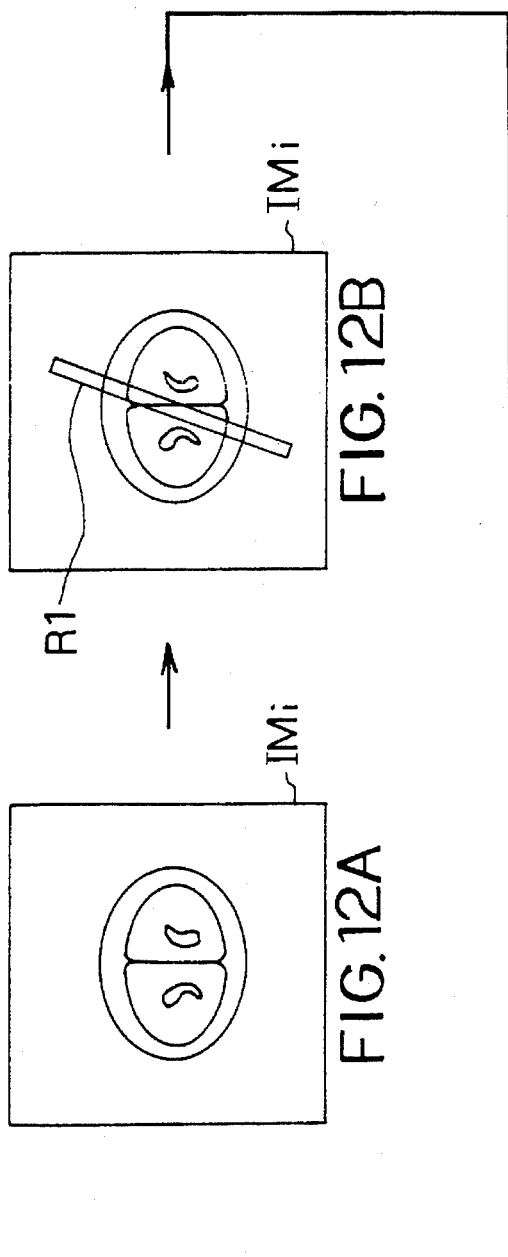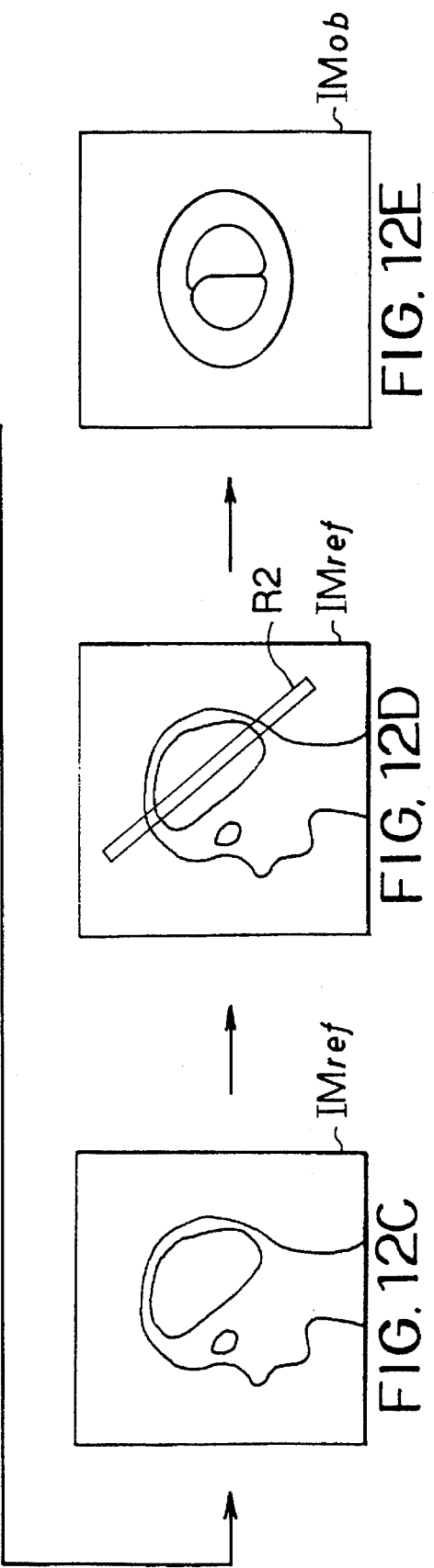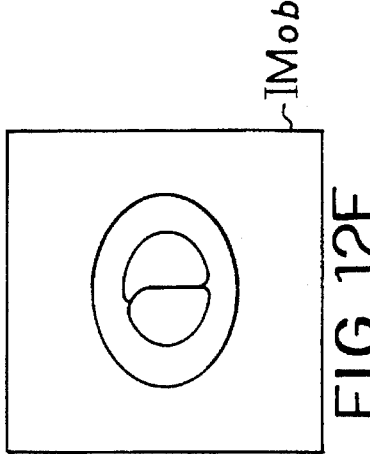
FIG. 12A  FIG. 12B  FIG. 12C  FIG. 12D  FIG. 12E

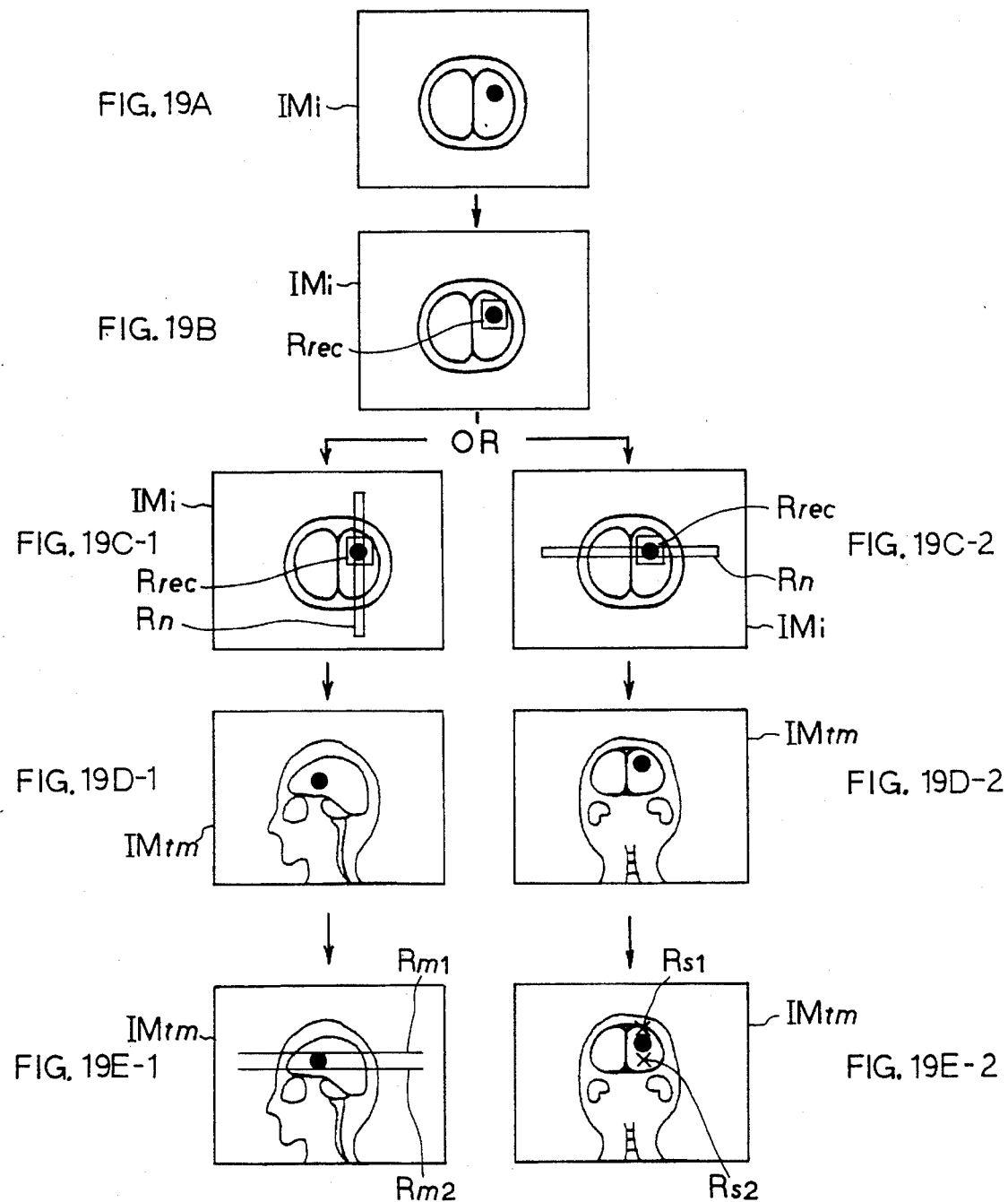

POSITIONING IN MAGNETIC RESONANCE IMAGING

BACKGROUND OF THE INVENTION

The present invention relates to a positioning technique in magnetic resonance imaging, and in particular, to the positioning technique applying multiplanar reconstruction (MPR) to a three-dimensional image data composed of a plurality of tomographic images collected at different slice positions of an object being diagnosed.

In magnetic resonance imaging, an object to be diagnosed is placed in a static magnetic field, whereby atomic nuclei align themselves with the static magnetic field. Then gradient magnetic fields in three x-, y- and z-directions are applied to the object for spatially encoding and a radio frequency (RF) signal is applied to the object for exciting the atomic nuclei in a magnetically sliced plane, which has a certain thickness in a slicing direction, of the object. When the RF signal is removed, magnetic resonance (MR) signals emitted from the sliced plane can be collected. A series of the excitation and MR signal acquisition is performed on a predetermined pulse sequence. The collected MR signals are then processed, for example, by Fourier transformation to form image data of the magnetically sliced plane of the object.

Prior to the scan for diagnosis, it is usual to perform a preparation which includes a process of positioning. There are two ways for the positioning; one way is to use a light localizer, and another way is to use one or two pilot images.

In positioning with a single pilot image, as shown in FIG. 1, a single tomographic image IMi (for instance, an axial image of an object) is given as a single pilot image. On the pilot image IMi, a linear ROI(region of interest) Ra is placed to specify an arbitrary linear position thereon, thus specifying a slice plane perpendicular to the pilot image IMi at its linear position specified by the ROI Ra. Slice positions to be scanned are determined such that they are parallel to the specified slice plane. As a result, a scan for diagnosis is carried out at the determined slice positions. Hereinafter, the term "linear ROI" is used for specifying a linear position, so this includes line ROIs and elongated rectangular ROIs.

On one hand, in positioning with two pilot images, as shown in FIG. 2, the first and second tomographic images IMi and IMj (for instance, both are axial images parallel to each other) are given as two pilot images. Then, one linear ROI Rb is placed on the first pilot image IMi and another linear ROI Rc is placed on the second pilot image IMj. In consequence, a slice plane passing through the two linear ROIs Rb and Rc at the same time can be specified for a scan. Using the two parallel pilot images enables positioning in any direction.

However, it is impossible for the above positioning ways with one and two pilot images to provide an entire tomographic image of a slice plane to be scanned before the diagnostic scan. Hence, there is no means for operators, such as doctors, who place the above linear ROIs to Judge whether or not the slice plane determined by the ROIs catches properly a desired lesion to be examined. In other words, for images except one or two pilot images, operators have to place one or two ROIs with his or her intuition or presumption.

Therefore, improper positioning situations have often been occurred; for example, the position of a lesion is different or deviates from a desired slice plane, for which a diagnostic scan will be carried out. In such cases, most of the images finally obtained will be useless and it is required to repeat the same process of positioning. This results in reduced efficiency of diagnostic throughput.

Further, operators are necessarily required to have a skilled technique and much experience for placing ROIs. So the positioning operation becomes a hard work.

Still further, although the slice position to be scanned can be shown by the two ROIs on the two pilot images, the slice angle of a slice plane are not easily recognizable thereon. As a result, it is difficult to designate a proper slice plane having a desired slice angle.

SUMMARY OF THE INVENTION

Accordingly, it is a primary object of the present invention to provide a positioning technique by which a slice image in a diagnostic scan can be confirmed before an actual diagnostic scan and a slice position can surely be arranged.

It is a further object of the present invention to provide a positioning technique to be able to perform precise and easy-to-operate positioning, thus preventing efficiency of diagnosis from being reduced.

It is a further object of the present invention to provide a positioning technique decreasing a volume of data calculation than in case that a prepared three-dimensional image data is directly processed.

It is a still further object of the present invention to provide a positioning technique by which a slice angle is easily recognizable.

These and other objects can be achieved according to the present invention, in one aspect by providing, a method of magnetic resonance imaging comprising steps of: a step of preparing a three-dimensional image data consisting of a plurality of tomographic image data of a diagnostic portion of an object being examined; a step of designating data of a pilot image in the three-dimensional image data; a step of displaying the pilot image; a step of placing a linear region of interest on the displayed pilot image; a step of editing image data of a cross-section from the three-dimensional image data, the cross-section passing through the linear region of interest in a space of the three-dimensional image data; and a step of displaying a prediction image for scan on the basis of the edited image data of the cross-section.

Further, by providing a method of magnetic resonance imaging comprising steps of: a step of preparing a three-dimensional image data consisting of a plurality of tomographic image data of a diagnostic portion of an object being examined; a step of designating data of a pilot image in the three-dimensional image data; a step of displaying the pilot image; a step of placing a first linear region of interest on the displayed pilot image; a step of editing image data of a first cross-section from the three-dimensional image data, the first cross-section passing through the first linear region of interest and being perpendicular to the pilot image in a space of the three-dimensional image data; a step of displaying a reference image on the basis of the image data of the first cross-section; a step of placing a second linear region of interest on the displayed reference image; a step of editing image data of a second cross-section from the three-dimensional image data, the second cross-section passing through the second linear region of interest in a space of the three-dimensional image data; and a step of displaying a prediction image for scan on the basis of the edited image data of the second cross-section.

Preferably, the pilot image consists of one image and the reference image consists of one image and said first and second linear regions of interest consist of one region of interest, respectively.

It is also preferred that the pilot image consists of one image and the reference image consists of two images, the first linear region of interest consists of two regions of interest placed on the one pilot image, and the second linear region of interest consists of two regions of interest placed on the two reference images, respectively. The two first linear regions of interest are parallel to each other on the pilot image and the two second linear regions of interest are parallel to each other over the two reference images.

It is also preferred that the step of editing image data of a second cross-section has a step of judging whether or not the second cross-section is twisted and a step of stopping the editing of the image data when the second cross-section is twisted.

It is preferred to further comprise a step of judging whether or not said prediction image is desired in response to a signal supplied for the prediction image. It is also preferred to further comprise steps of: a step of performing a scan plan on the basis of the prediction image, when the prediction image is desired; and a step of performing said scan in accordance with the scan plan.

Still further, by providing a method of magnetic resonance imaging comprising steps of: a step of preparing a three-dimensional image data consisting of a plurality of tomographic image data of a diagnostic portion of an object being examined; a step of designating data of a pilot image in the three-dimensional image data; a step of displaying the pilot image; a step of placing a two-dimensional data collecting area on the displayed pilot image; a step of placing a linear region of interest on the displayed pilot image, the linear region of interest passing through the two-dimensional data collecting area; a step of editing image data of a cross-section from the three-dimensional image data, the cross-section passing through the linear region of interest and being perpendicular to the pilot image in a space of the three-dimensional image data; a step of displaying a reference image on the basis of the image data of the cross-section; and a step of specifying a one-dimensional data collecting range on the displayed reference image, the one-dimensional data collecting range, together with the two-dimensional data collecting area, determining a three-dimensional voxel size for local excitation in spectroscopy.

In another aspect by providing, a system for magnetic resonance imaging comprising: an element for preparing a three-dimensional image data consisting of a plurality of tomographic image data of a diagnostic portion of an object being examined; an element for designating data of a pilot image in the three-dimensional image data; an element for displaying the pilot image; an element for placing a linear region of interest on the displayed pilot image; an element for editing image data of a cross-section from the three-dimensional image data, the cross-section passing through the linear region of interest in a space of the three-dimensional image data; and an element for displaying a prediction image for scan on the basis of the edited image data of the cross-section.

Further, by providing, a system for magnetic resonance imaging comprising: an element for preparing a three-dimensional image data consisting of a plurality of tomographic image data of a diagnostic portion of an object being examined; an element for designating data of a pilot image in the three-dimensional image data; a first element for displaying the pilot image; a first element for placing a first linear region of interest on the displayed pilot image; a first element for editing image data of a first cross-section from the three-dimensional image data, the first cross-section passing through the first linear region of interest and being perpendicular to the pilot image in a space of the three-dimensional image data; a second element for displaying a reference image on the basis of the image data of the first cross-section; a second element for placing a second linear region of interest on the displayed reference image; a second element for editing image data of a second cross-section from the three-dimensional image data, the second cross-section passing through the second linear region of interest in a space of the three-dimensional image data; and a third element for displaying a prediction image for scan on the basis of the edited image data of the second cross-section.

BRIEF DESCRIPTION OF THE DRAWINGS

The accompanying drawings which are incorporated in and constitute a part of this specification, illustrate embodiments of the present invention and, together with the description, serve to explain the principles of the present invention. In the drawings:

FIGS. 12A to 12E are illustrations explaining changes in images displayed in the third embodiment;

FIGS. 19A, 19B, 19C-1, 19C-2, 19D-1, 19D-2, 19E-1, 19E-2 are illustrations explaining changes in images displayed in the sixth embodiment.

DESCRIPTION OF THE PREFERRED EMBODIMENTS

Embodiments of the present invention will now be described with reference to the accompanying drawings.

Figure 3:
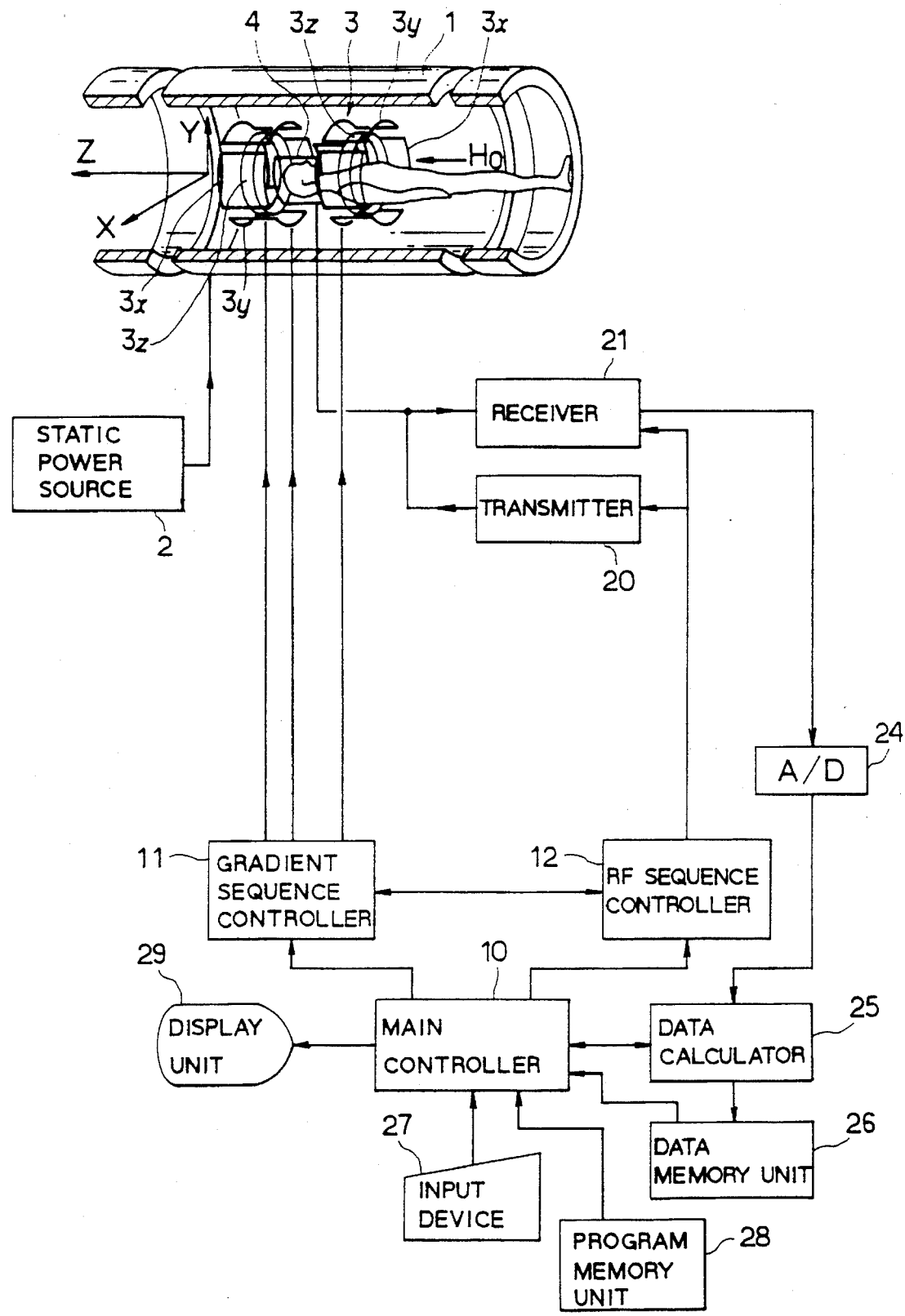
FIG. 3 is a block diagram showing an MRI system of a first embodiment of the present invention.

A first embodiment of the present invention will now be described according to FIGS. 3 to 8. FIG. 3 is a block diagram schematically representing the whole construction of an MRI system of the first embodiment.

The MRI system shown in FIG. 3 comprises a magnet 1 generally formed into a cylinder shape having a hollow portion therein for placing a patient P, and a static power source 2 for supplying required electric current to the magnet 1. When the magnet 1 begins to work, a static field, having a uniform magnetic strength $H_0$ and being directed in Z-direction along the body axis of the patient P, is formed in the central diagnostic space in the hollow portion of the magnet 1.

In the hollow portion of the magnet 1, there is provided a gradient coil portion 3. The gradient coil portion 3 includes two pairs of x-coils $3x$ ... $3x$ for generating a field gradient in X-direction, two pairs of y-coils $3y$ ... $3y$ for generating a field gradient in Y-direction, and one pair of z-coils $3z$ and $3z$ for generating a field gradient in Z-direction.

An RF coil 4 is disposed in the inner space of the magnet 1, whereby the patient P inserted into the inner space is surrounded by the RF coil 4 and the gradient coils $3x$ ... $3z$. The RF coil 4 is in charge of transmitting and receiving radio frequency(RF) magnetic pulses to and from the patient P.

The MRI system is also provided with a main controller 10 controlling the entire system, a gradient sequence controller 11 controlling the pulse sequences to the field gradients, an RF sequence controller 12 controlling the pulse sequence to the RF signal. The main controller 10 comprises a computer for entire control of the entire system. The main controller 10 is able to send a start signal and a stop signal of the pulse sequences to the controllers 11 and 12.

The gradient sequence controller 11 is also provided with a computer which stores programs of pulse sequences including a multi-slice and a gradient field echo process, for example. In response to the start signal from the main controller 10, the gradient sequence controller 11 is to supply pulsed currents to the x-coils $3x$ ... $3x$, y-coils $3y$ ... $3y$, and z-coils $3z$ and $3z$, respectively, according to a given sequence.

As shown in FIG. 3, the RF sequence controller 12 is connected to the RF coil 4 by way of a transmitter 20 and a receiver 21. The transmitter 20 is designed to supply a radio frequency(RF) pulsed current to the RF coil 4, thus a high frequency magnetic field generated from the RF coil 4 being sent to a diagnostic portion of the patient P. MR signals emitted from the diagnostic portion of the patient P can be detected by the RF coil 4 and received by the receiver 21 through control of the RF sequence controller 12.

The received MR signals are sent, by way of an analogue to digital converter 24, to a data calculator 25 to be reconstructed therein into corresponding image data with Fourier transformation, for example. The image data thus-reconstructed is designed to be stored in a data memory unit 26.

The main controller 10 is also connected to an input device 27, a program memory unit 28, and a display unit 29. The reconstructed image data can be supplied, through the main controller 10, to the display unit 29. The program memory unit 28 stores a procedure from positioning to scanning shown in FIG. 4. This procedure is to be taken into a work area of the main controller 10, when the present MRI system is started.

The entire operation of this embodiment will now be explained using FIGS. 4 to 7.

Figure 4:
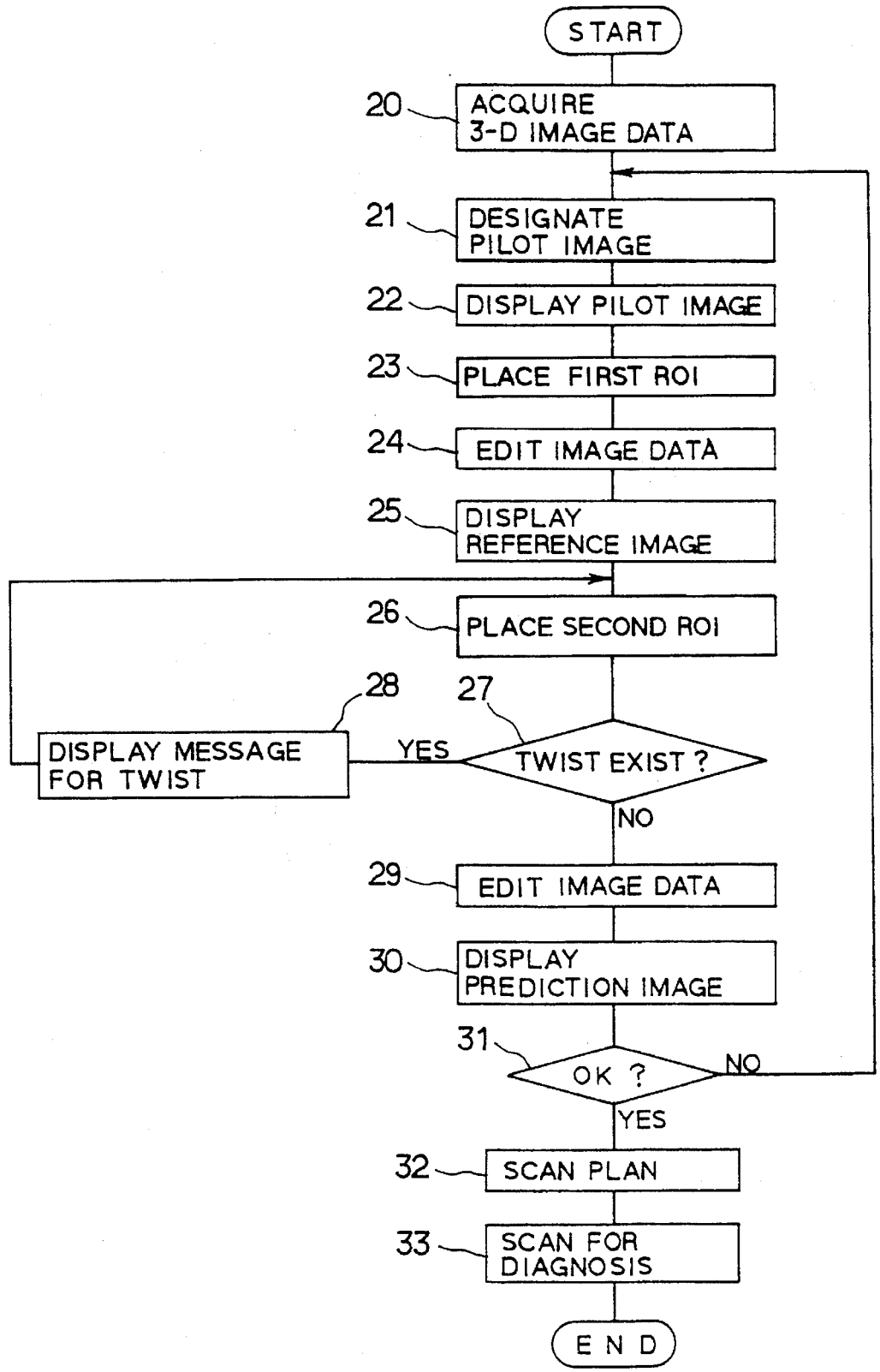
FIG. 4 is a flowchart explaining the positioning procedure in the first embodiment.

After the arrangement and registration of a patient, the procedure shown in FIG. 4 will be started by the main controller 10.

Figure 5:
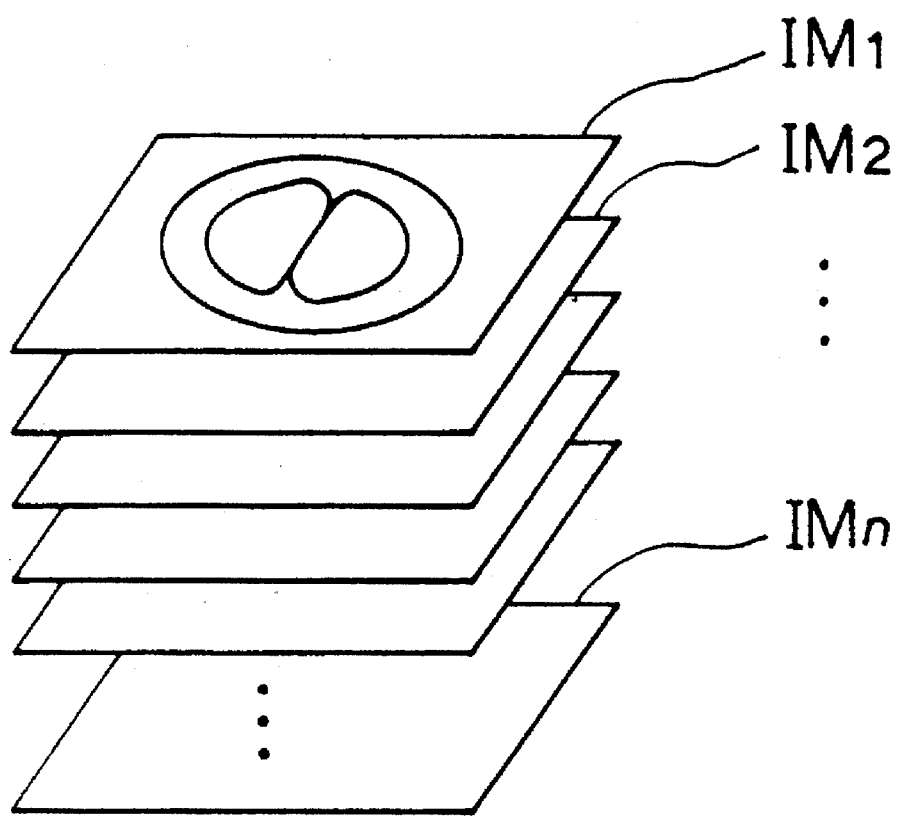
FIG. 5 is an explanatory view of a three-dimensional image data.

At Step 20 in FIG. 4, a command of multi-slice imaging is sent to the gradient and RF sequence controllers 11 and 12. The multi-slice imaging slices a portion containing a lesion at its plural but adjacent slice positions, thus providing a three-dimensional image data of a plurality of tomographic images IM1 to IMn for positioning, as shown in FIG. 5.

Then at Step 21, among the plurality of images IM1 to IMi, a single tomographic image IMi is designated as a pilot image for the positioning. This designation is done in response to either an image position command from an operator through the input device 27 or a predetermined automatically-generated command therein. As a result, for example, a tomographic image at the front is designated as a pilot image.

Figure 6A:
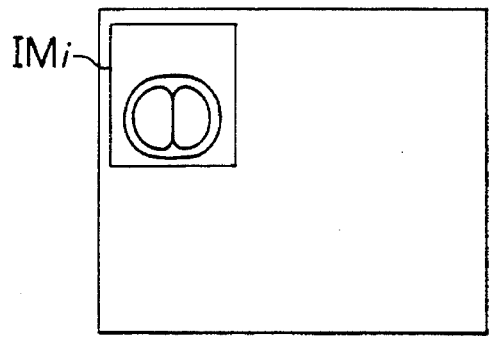
FIGS. 6A to 6E are illustrations explaining changes in images displayed in the first embodiment.

Then at Step 22, the pilot image IMi thus-designated is displayed on the display unit 29 as shown in FIG. 6A, for instance.

Figure 6B:
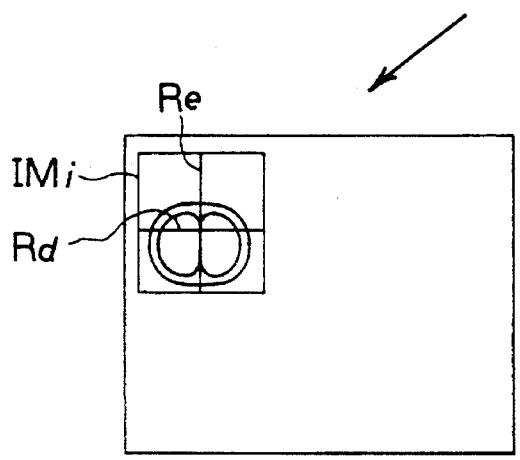

At Step 23, by way of the input device 27, the operator places two linear ROIs Rd and Re at desired positions on the displayed pilot image IMi, as shown in FIG. 6B. The two linear ROIs Rd and Re compose first linear ROIs of the present invention. In this embodiment, while one ROI Rd specifies a cross-section in the transverse direction of the pilot image IMi in FIG. 6B, the other ROI Re specifies a cross-section in the longitudinal direction perpendicular to the transverse direction. As another variation, it is possible to place the two ROIs Rd and Re obliquely crossed with each other.

Then the process at Step 24 will be carried out. Namely, two cross-sections, passing through each of the linear positions of the two ROIs Rd and Re and being perpendicular to the pilot image IMi, are estimated. Image data of pixels composing the two cross-sections are each edited (i.e., searched and gathered) from the three-dimensional image data.

Figure 6D:
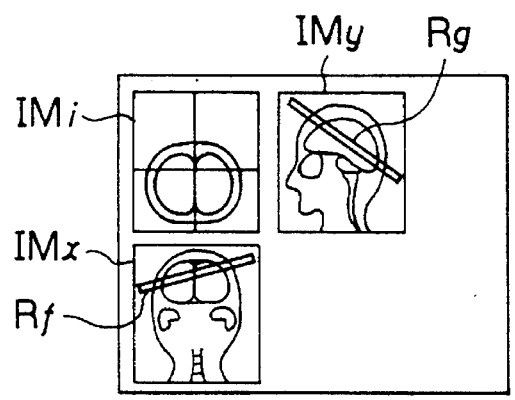
Figure 6C:
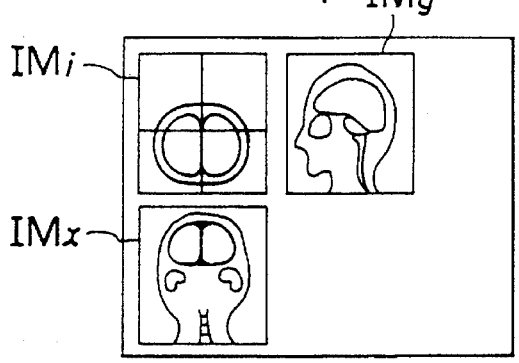

At Step 25, in divided form shown in FIG. 6C, the image data of the two perpendicular cross-sections edited at Step 24 are displayed on the display unit 29 as a transverse cross-section image IMx and a longitudinal cross-section image IMy, the both images IMx and IMy corresponding to reference images of the present invention.

At the next Step 26, as illustrated in FIG. 6D, elongated rectangular ROIs Rf and Rg are each manually placed by the operator on the transverse and longitudinal cross-section images IMx and IMy. In this situation, the operator can observe carefully the cross-section images IMx and IMy, and select the positions for the elongated rectangular ROIs Rf and Rg such that a cross-section passing through the ROIs Rf and Rg becomes a desired slice plane to be scanned.

After the placing of the ROIs Rf and Rg, which correspond to second linear ROIs of the present invention, Step 27 is processed. At this Step 27, it is judged whether or not the cross-section passing through the two ROIs Rf and Rg is twisted. If Yes (twisted), the procedure of Step 28 will be done. That is, it is displayed that the editing of image data for the cross-section passing through the two ROIs Rf and Rg is impossible, because of the twist of the cross-section. In this situation, the processing will be returned to Step 26 for resetting the elongated rectangular ROIs Rf and Rg.

In contrast, when No at Step 27 (not twisted), the processing will go on to Steps 29 to 31.

At Step 29, one cross-section, passing through the linear positions of the two ROIs Rf and Rg at the same time, is estimated. Image data of pixels composing the cross-section is edited also from the three-dimensional image data. For example, in case of the two oblique ROIs Rf and Rg illustrated in FIG. 6D, the cross-section passing the ROIs Rf and Rg becomes an oblique slice plane shown in FIG. 7, the oblique slice plane slicing the head of a patient obliquely in both front-to-back and left-to-right directions with no twist. Therefore, proper selection of the angles of the two ROIs Rf and Rg enables the specification of any slice plane having an arbitrary slice angle and having no twist, in addition to axial, sagittal and coronal images.

Figure 6E:
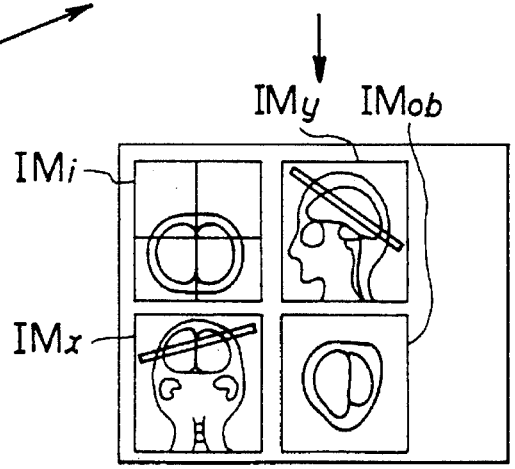
Figure 7:
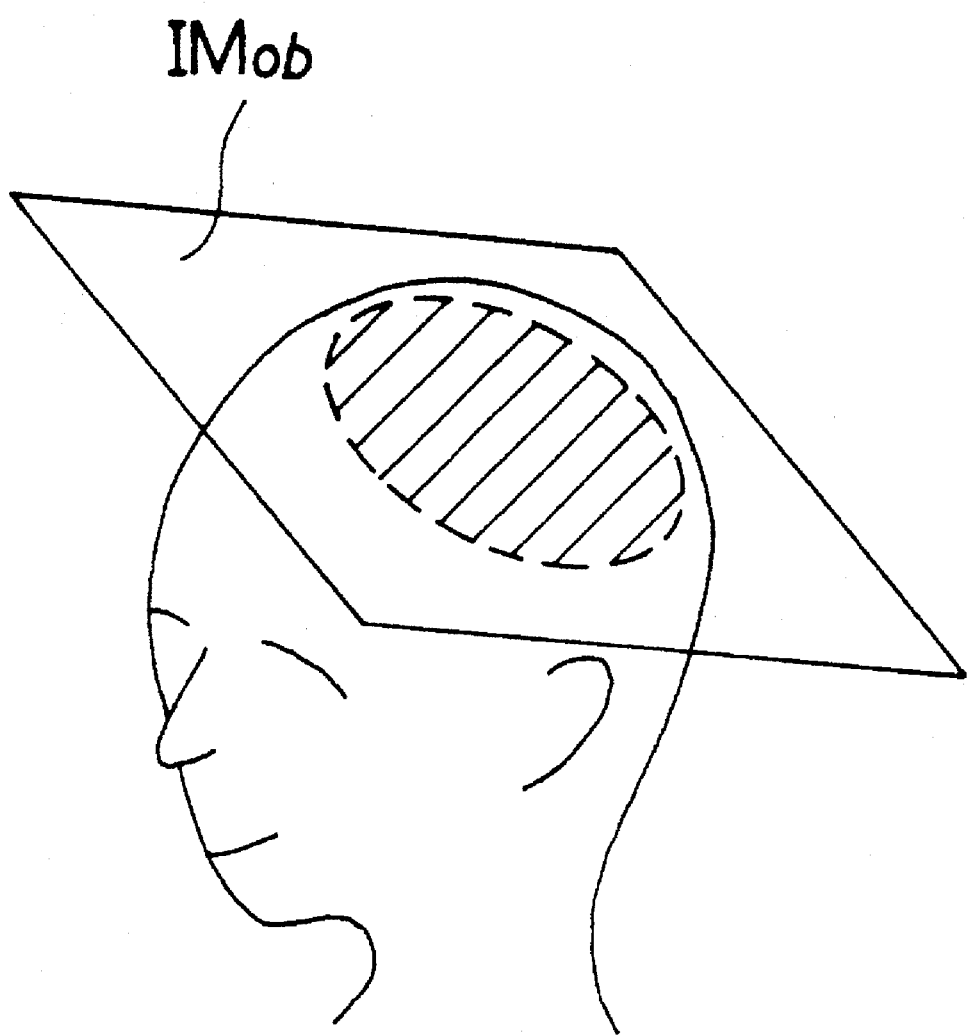
FIG. 7 exemplifies an explanatory view of a prediction image.

Then at Step 30, the image data thus-edited at Step 29 is displayed, as a prediction image IMob, on the display unit 29, as shown in FIG. 6E by divided form. That is, even if a diagnostic scan has not been carried out yet, the monitor of the display unit 29 provides the prediction image IMob, which is a tomographic image edited from the three-dimensional data in positioning. For example, when the oblique cross-section shown in FIG. 7 is specified by the ROIs Rf and Rg, the prediction image IMob is its tomographic image.

Hence, the prediction image IMob have a meaning that when a diagnostic scan will is carried out, the resultant reconstructed image is approximately like so, thus providing the operator an appropriate scan image beforehand. As the prediction image IMob is created by editing from the three-dimensional image date once reconstructed, it is true that the prediction image IMob is lower in diagnostic information values than the original three-dimensional image date. But still, the prediction image IMob maintains configuration information with high accuracy, besides information of a slice angle.

Then at Step 31, the operator Judges whether or not the prediction image IMob is acceptable for a diagnostic scan carried out later on. When acceptable (YES), at Step 32, a desired scan plan is done using information (such as a slice angle and a position of a lesion) obtained from the prediction image IMob.

Finally, at Step 33, under the scan plan including a given pulse sequence, a scan for diagnostic is carried out, thereby providing reconstructed images of a lesion of the patient.

If the prediction image IMob is not satisfied (NO), the processing will be returned to Step 21 for resetting of it.

As mentioned above, the MRI system of the present invention utilizes a technique of multiplanar reconstruction (MPR) and provides a tomographic image as a prediction image of a cross-section along which a diagnostic scan is to be carried out. An operator can confirm the prediction image by direct observation beforehand. It is not required to position a slice plane to be scanned on the basis of operator's intuition or estimation, thus leading to steadier positioning.

In consequence, errors in positioning are reduced substantially than the conventional positioning technique, with the result that higher quality images can be obtained through the scan.

In addition, according to this embodiment, when a prediction image IMob displayed once is not satisfied for an operator, it can easily be re-displayed through the resetting of ROIs. Operation skill is relieved greatly and positioning operation is greatly facilitated. These lead to increased throughput in diagnosis.

Furthermore, because the present invention uses two-dimensional images as a pilot image and reference images in a three-dimensional image, it is easy for an operator to access the three-dimensional image data. Also, calculation load for data processing is rather reduced, compared with a data processing technique handling a three-dimensional image data directly.

Figure 8:
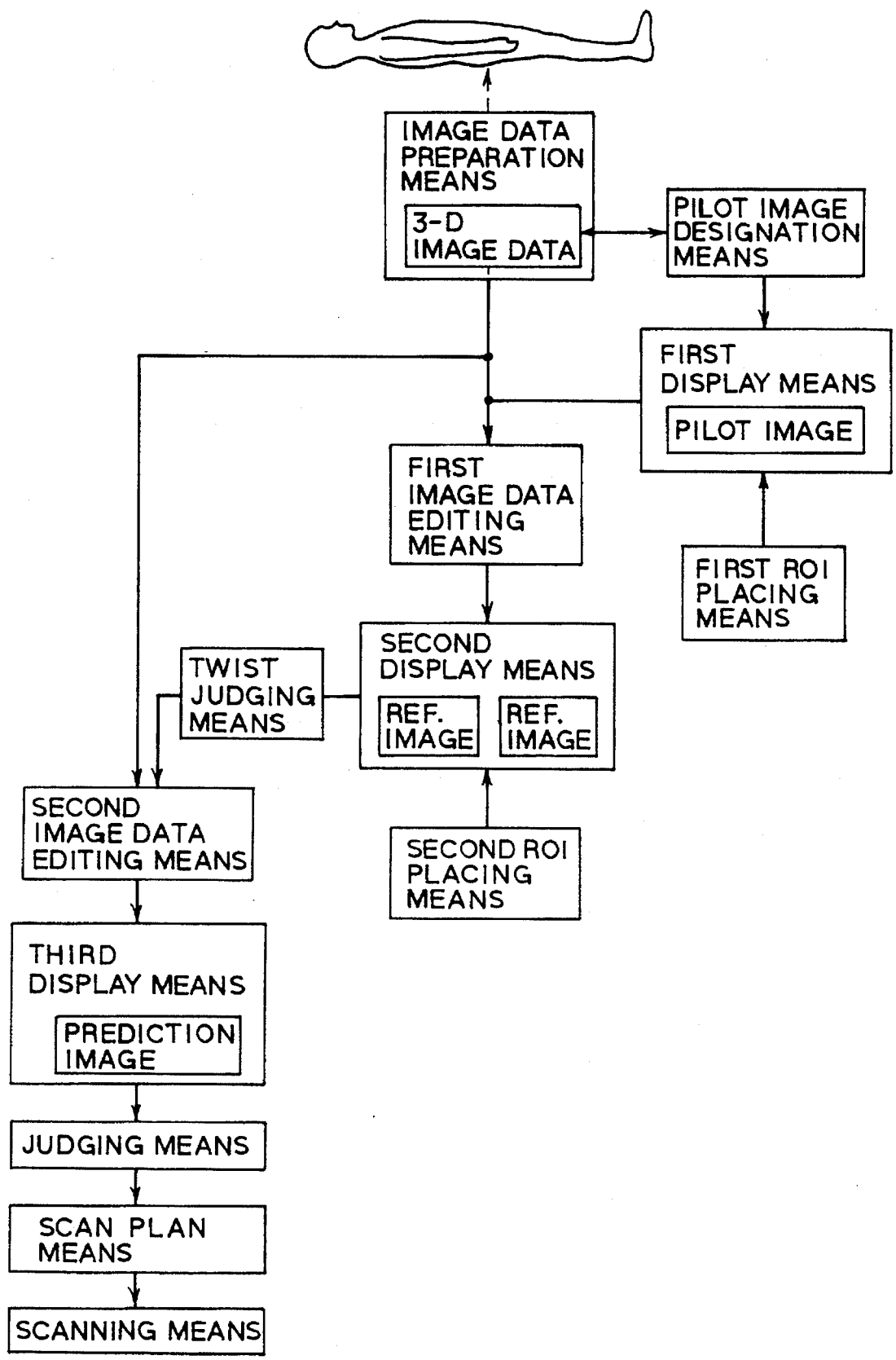
FIG. 8 is a functional block diagram showing a relation between the first embodiment and the present invention.

The functional block of the MRI system in accordance with the present embodiment can be illustrated as shown in FIG. 8. The processing of Step 20 in FIG. 4 composes the main part of an image data preparation means. Also, Step 21 composes the main part of a pilot image designation means, Step 22 composes the main part of a first display means, and Step 23 composes the main part of a first ROI placing means. Moreover, Step 24, 25 and 26 are included into a first image data editing means, a second display means and a second ROI placing means, respectively. Further, Step 27 corresponds a twist judging means. Steps 29 and 30 compose the main parts of a second image data editing means and a third display means, respectively. Still further, Step 31 composes a judging means. Steps 32 is included in a scan plan means and Step 33 is included in a scanning means.

In the first embodiment, judgement for the pilot image and/or the reference images, that is, question steps asking if they are desired or not can be inserted between Steps 22 and 23 and/or between Steps 25 and 26 in FIG. 4.

A second embodiment of the present invention will now be described according to FIGS. 9 and 10. The hardware construction of an MRI system in this embodiment is the same as that in the first embodiment, except that the positioning process carried out by the main controller 10. The same or equivalent hardware components use the same reference numerals as the first embodiment. This usage of the reference numerals are applied to all of the following embodiments.

The second embodiment uses a way in which the judgement of the twist for the final cross-section is not required, instead of adding some restrictions to the placing of the ROIs in the first embodiment.

Figure 9:
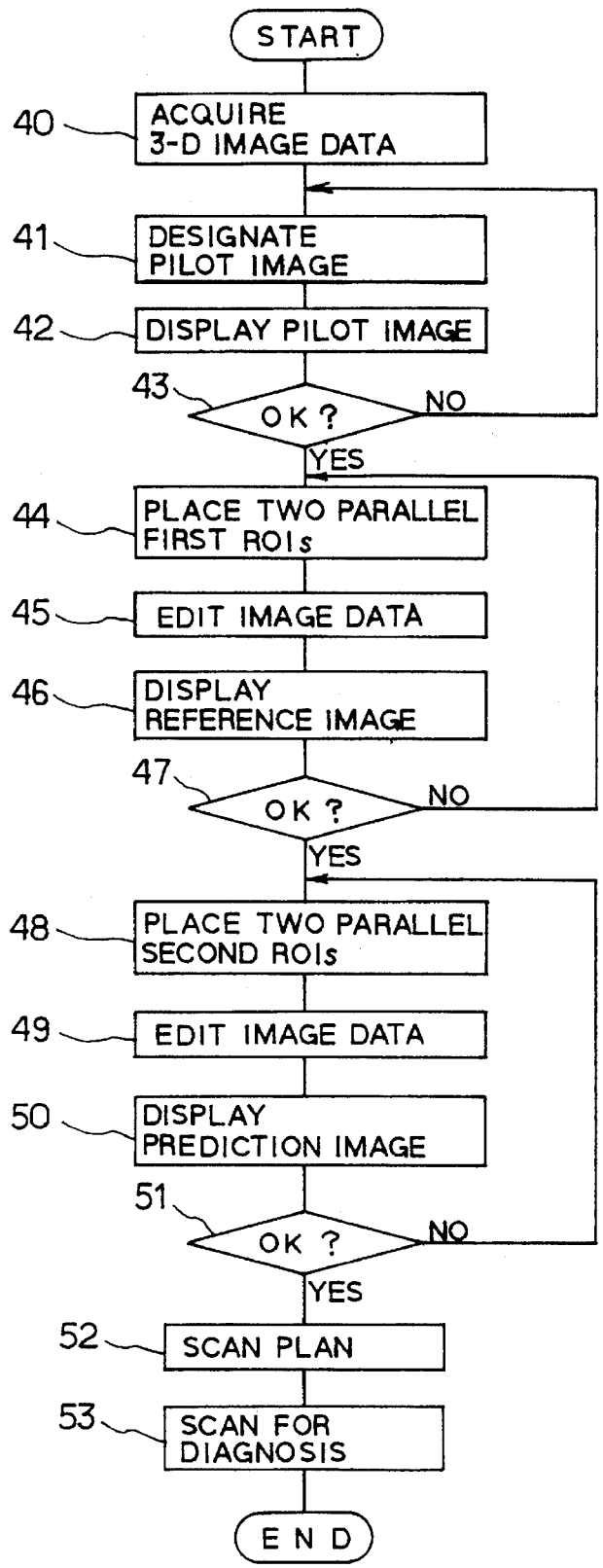
FIG. 9 is a flowchart explaining the positioning procedure in a second embodiment.

FIG. 9 shows a procedure from positioning to scanning in the second embodiment carried out by the main controller 10.

Steps 40 to 42 in FIG. 9, which are carried out in turn, are the same as Steps 20 to 22 in FIG. 4. This leads to the display of a one pilot image IMi (for example, an axial image of a head shown in FIG. 10A), which is one of the three-dimensional image data IM1 to IMn.

Then at Step 43, it is judged whether or not the pilot image IMi is proper and acceptable, on the basis of signals through the input device 27 from an operator. If NO (another pilot image is desired), the processing will be returned to Step 41 for resetting. If YES (pilot image now on display is acceptable), the processing of Steps 44 to 46 will be done as follows.

Figures 10A, 10B, 10C, 10D, 10E:
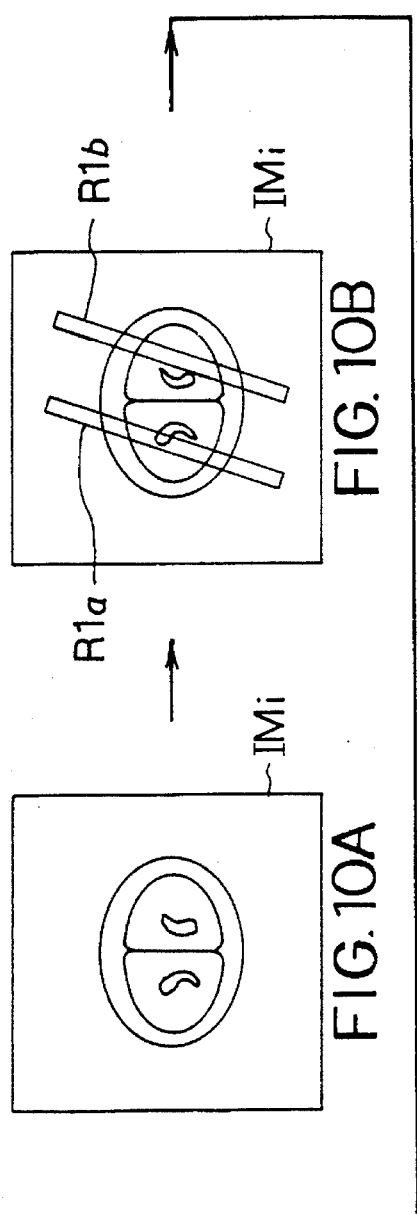
FIGS. 10A to 10E are illustrations explaining changes in images displayed in the second embodiment.

At Step 44, in response to ROI designation signals from the operator, two elongated and rectangular first ROIs R1a and R1b are placed in parallel on desired positions on the pilot image IMi. For example, as shown in FIG. 10B, the ROIs R1a and R1b are placed such that on the pilot image they are oblique and parallel to each other. These first ROIs R1a and R1b correspond to first linear ROIs of the present invention.

At Step 45, in the same way as Step 24 in FIG. 4, image data of two cross-sections, perpendicular to the pilot image IMi at the positions of the ROIs R1a and R1b, are edited from the three-dimensional image data. At Step 46, as illustrated in FIG. 10C, the image data of the two cross-sections thus edited are displayed as two reference images IMa and IMb, respectively. In case of FIG. 10C, the reference images IMa and IMb are tomographic images sliced along longitudinal directions of a head at the positions of the ROIs R1a and R1b.

Then at Step 47, it is judged whether the reference images IMa and IMb are acceptable. As a result, when NO (not acceptable) comes out thereat, the processing is to be returned to Step 44 for resetting of the first ROIs R1*a* and R1*b*. In contrast, when YES (acceptable) comes out, Steps 48 to 50 will proceed.

At Step 48, as exemplified in FIG. 10D, two elongated and rectangular second ROIs R2*a* and R2*b* are each placed in parallel on desired positions on the two reference images IMa and IMb, the reference images IMa and IMb being displayed on condition that their directions are aligned in the same direction. These second ROIs R2*a* and R2*b* correspond to second linear-ROIs of the present invention.

Steps 49 and 50 is the same as Steps 29 and 30, thus editing image data of a cross-section passing through the two ROIs R2*a* and R2*b* and displaying a prediction image IMob, as shown in FIG. 10E, using the edited image data. Namely, on top of axial, sagittal and coronal images, an oblique prediction image IMob having an arbitrary slice angle can be displayed.

Further, at Step 51, it is Judged if the prediction image IMob is acceptable or not. If another prediction image IMob is desired (NO), the processing will then be returned to Step 48. Contrary to it, the prediction image IMob is acceptable (YES), Steps 52 and 53 will be done in the same way as Steps 32 and 33 in FIG. 4, with the result that a scan plan and a diagnostic scan are carried out.

As apparent from the above, the second embodiment can offer almost the same advantages as the first embodiment. Besides, as each pair of the first and second ROIs R1*a*, R1*b* and R2*a*, R2*b* are placed in parallel to each other, the judgement of twist of the final cross-section is not required, resulting in much simplified processing. Moreover, on the way to the scan plan, three judgements (refer to Steps 43, 47 and 51) are inserted and the operator are asked if the pilot image IMi, the reference images IMa and IMb, and the prediction image IMob is acceptable or not at each stage. This gives a steady positioning operation at each stage and can shorten the whole operation time when the final prediction image IMob is not acceptable, compared with the first embodiment.

In the second embodiment, the judgement of Steps 43 and/or 47 in FIG. 9 can be omitted, if necessary.

A third embodiment of the present invention will now be described according to FIGS. 11 and 12.

In the third embodiment, the number of the first ROI and the second ROI is reduced to one, respectively.

Figure 11:
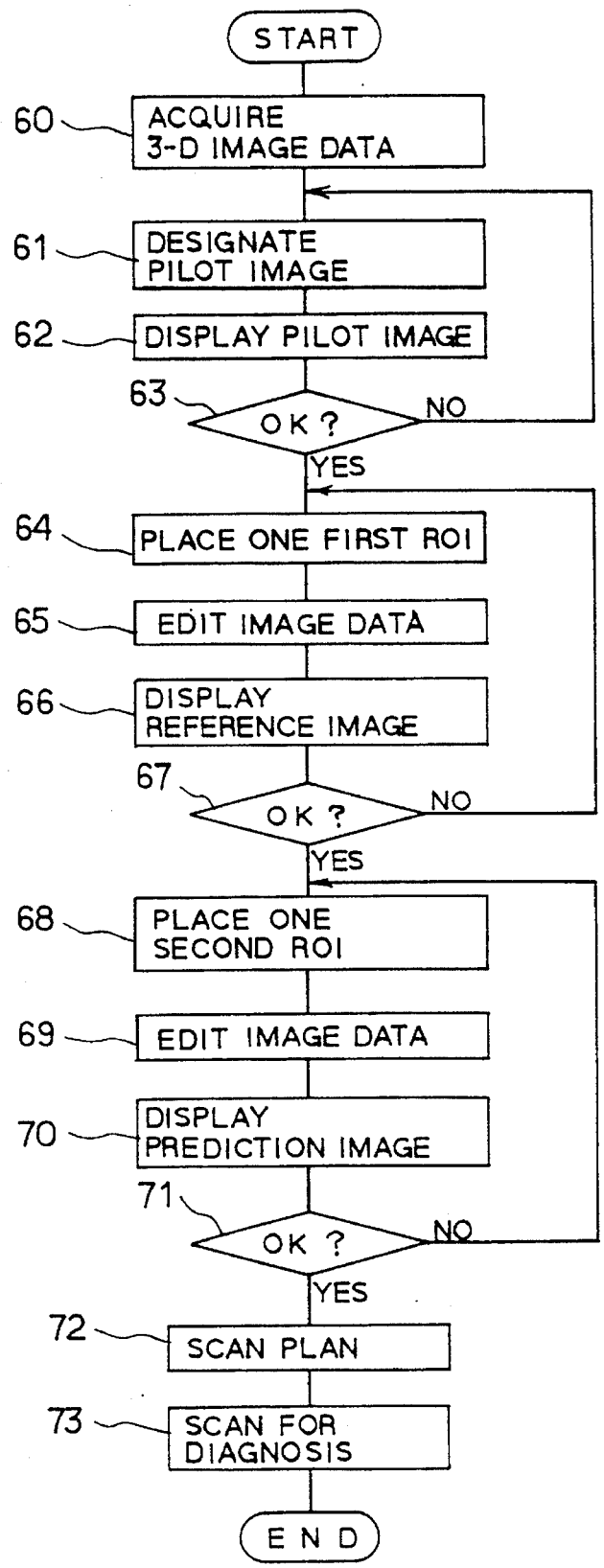
FIG. 11 is a flowchart explaining the positioning procedure in a third embodiment.

FIG. 11 shows a procedure from positioning to scanning in the third embodiment carried out by the main controller 10. Steps 60 to 63 in FIG. 11 are the same as Steps 40 to 43 in FIG. 9. As a result, a pilot image IMi (for example, an axial image of a head) is displayed on the display unit 29, as shown in FIG. 12A.

Then at Step 64, a single elongated rectangular first ROI R1 (corresponding to a first linear ROI of the present invention) is placed at a desired position on the pilot image IMi, as shown in FIG. 12B. At Step 65, image data of a cross-section passing through the first ROI R1 and being perpendicular to the pilot image IMi are edited from the three-dimensional image data. At Step 66, the image data of the perpendicular cross-section thus-edited are displayed as a single reference image IMref, as illustrated in FIG. 12C.

Then at Step 67, it is Judged whether or not the reference image IMref is acceptable. When not accepted (NO), the processing will be returned to Step 64. When accepted (YES), Step 68 will be carried out such that, as shown in FIG. 12D, a single elongated rectangular second ROI R2 (corresponding to a second linear ROI of the present invention) is placed at a desired position on the reference image IMref. Also at Step 68, image data of a cross-section passing through the second ROI R2 and being perpendicular to the reference image IMref are edited from the three-dimensional image data. At Step 70, the image data of the perpendicular cross-section thus-edited are displayed as a prediction image IMob, as illustrated in FIG. 12E. The prediction image IMob can give any oblique tomographic image, besides axial, sagittal and coronal images.

In addition, Steps 71 to 73, the same as Steps 51 to 53 in FIG. 9, is carried out in turn.

Because the first and second ROIs are each one, ROI placing operation and data processing are simplified. Further, the prediction image is also reduced in number than the first and second embodiments, but still maintains enough tomographic information to diagnostic scan. Still further, the three confirmations (refer to Steps 63, 67 and 71) gives a steady positioning operation.

A fourth embodiment of the present invention will now be described according to FIGS. 13 to 15.

In the fourth embodiment, the positioning is reduced to one process stage.

Figure 13:
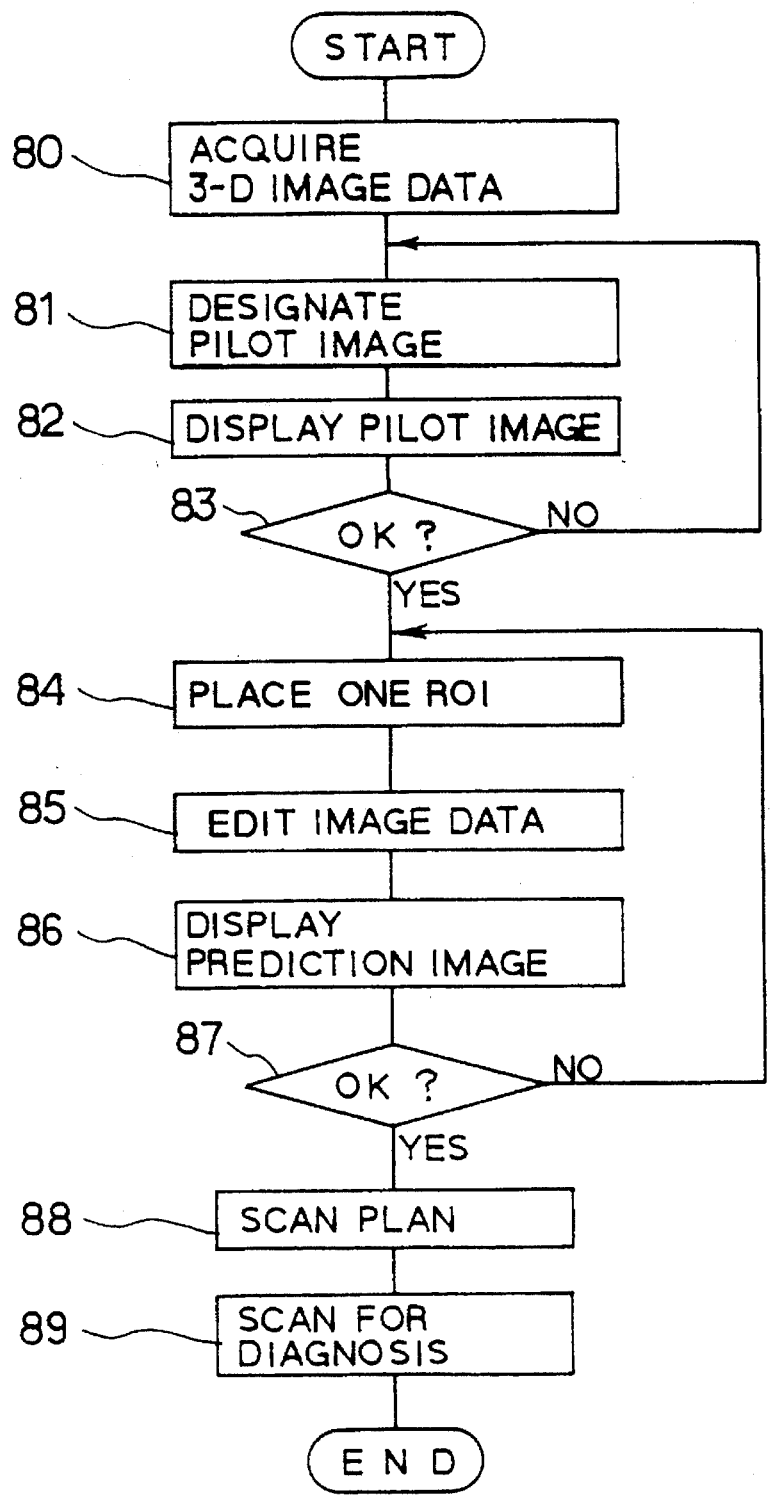
FIG. 13 is a flowchart explaining the positioning procedure in a fourth embodiment.

FIG. 13 shows a procedure from positioning to scanning in the fourth embodiment carried out by the main controller 10. Steps 80 to 85 in FIG. 13 are the same as Steps 60 to 65 in FIG. 11. As a result, a single ROI R1 is placed on a pilot image IMi as shown in FIGS. 14A and 14B, and image data of a cross-section passing through the ROI R1 and being perpendicular to the pilot image IMi are edited.

Figure 14C:
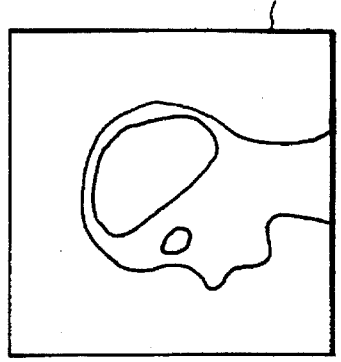
FIGS. 14A to 14C are illustrations explaining changes in images displayed in the fourth embodiment.
Figure 14B:
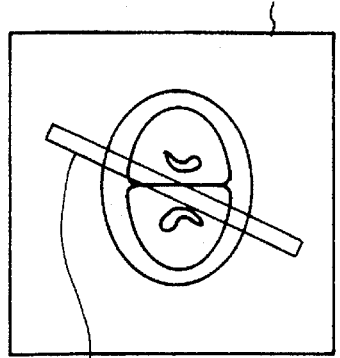
Figure 14A:
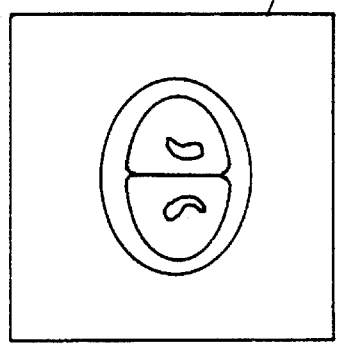

Then at Step 86, the image data of the cross-section are displayed as a prediction image IMob, as shown in FIG. 14C. Then Steps 87 to 89 is processed in the same way as Steps 71 to 73 in FIG. 11.

The fourth embodiment is able to obtain a prediction image without a reference image. The process to obtain the prediction image is shortened to only one stage, so the processing for data editing is simplified.

Figure 15:
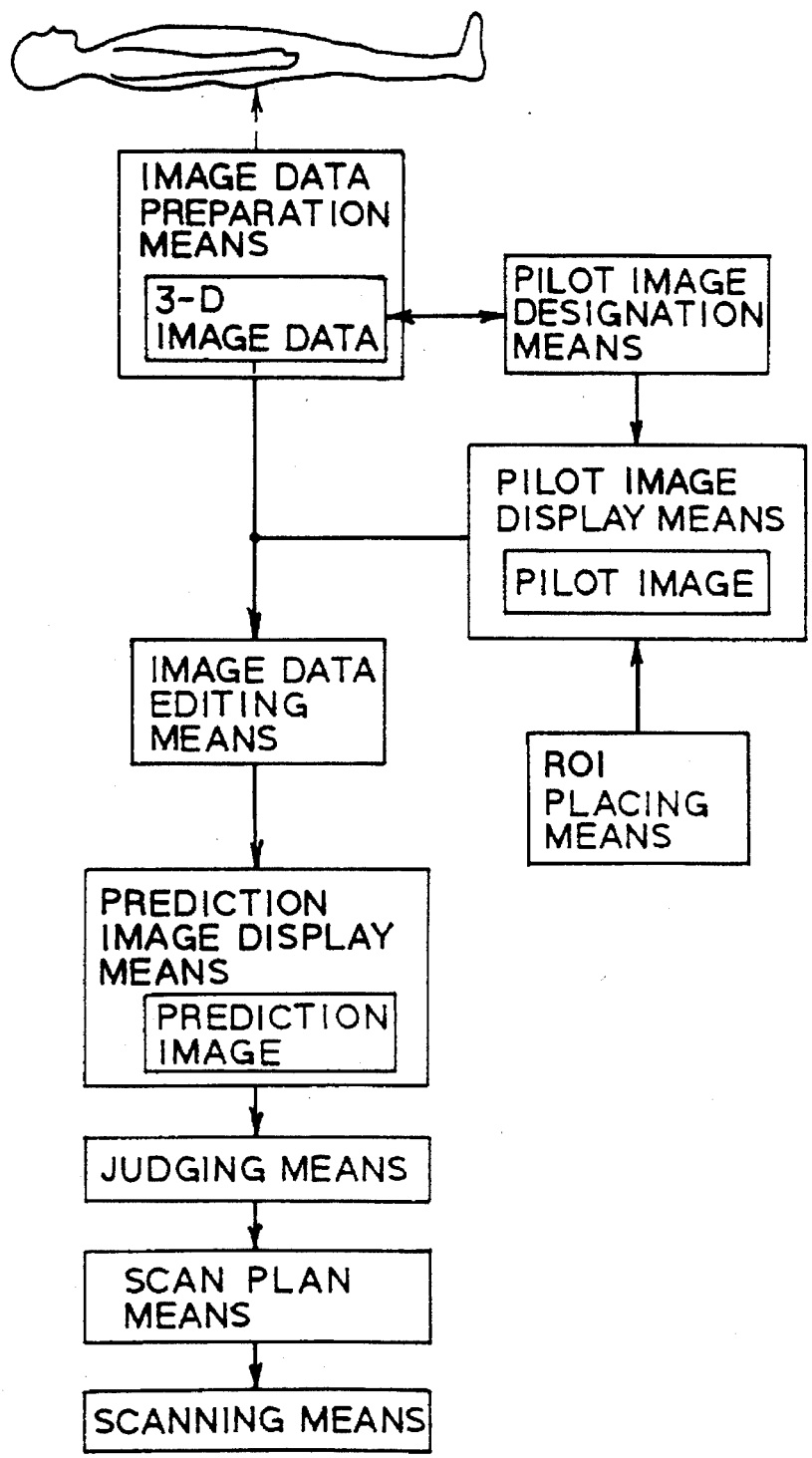
FIG. 15 is a functional block diagram showing a relation between the fourth embodiment and the present invention.

In this embodiment, as shown in FIG. 15, Step 80 in FIG. 13 composes the main part of an image data preparation means of the present invention. Also, Step 81 composes the main part of a pilot image designation means and Step 82 does the main part of a pilot image display means. Further Step 84 is included in a ROI placing means. Steps 85 and 86 are included in an image data editing means and a prediction image display means, respectively. Furthermore, Step 87 corresponds to a judging means. Step 88 composes a part of a scan plan means and Step 89 composes a part of a scanning means.

A fifth embodiment of the present invention will now be described according to FIGS. 16 and 17.

In the fifth embodiment, the positioning still consists of one stage, but two pilot images are used therein.

Figure 16:
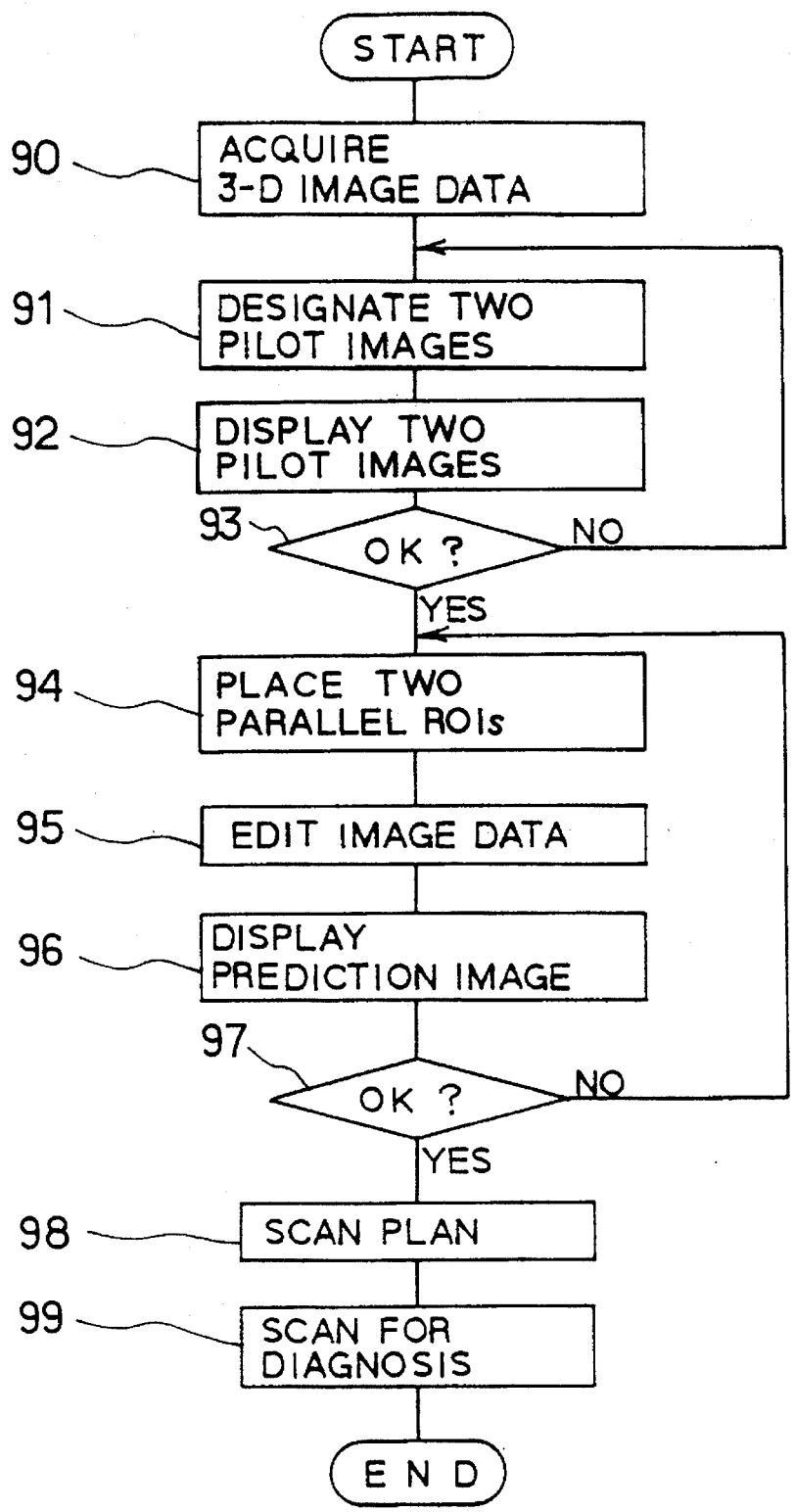
FIG. 16 is a flowchart explaining the positioning procedure in a fifth embodiment.
Figure 17:
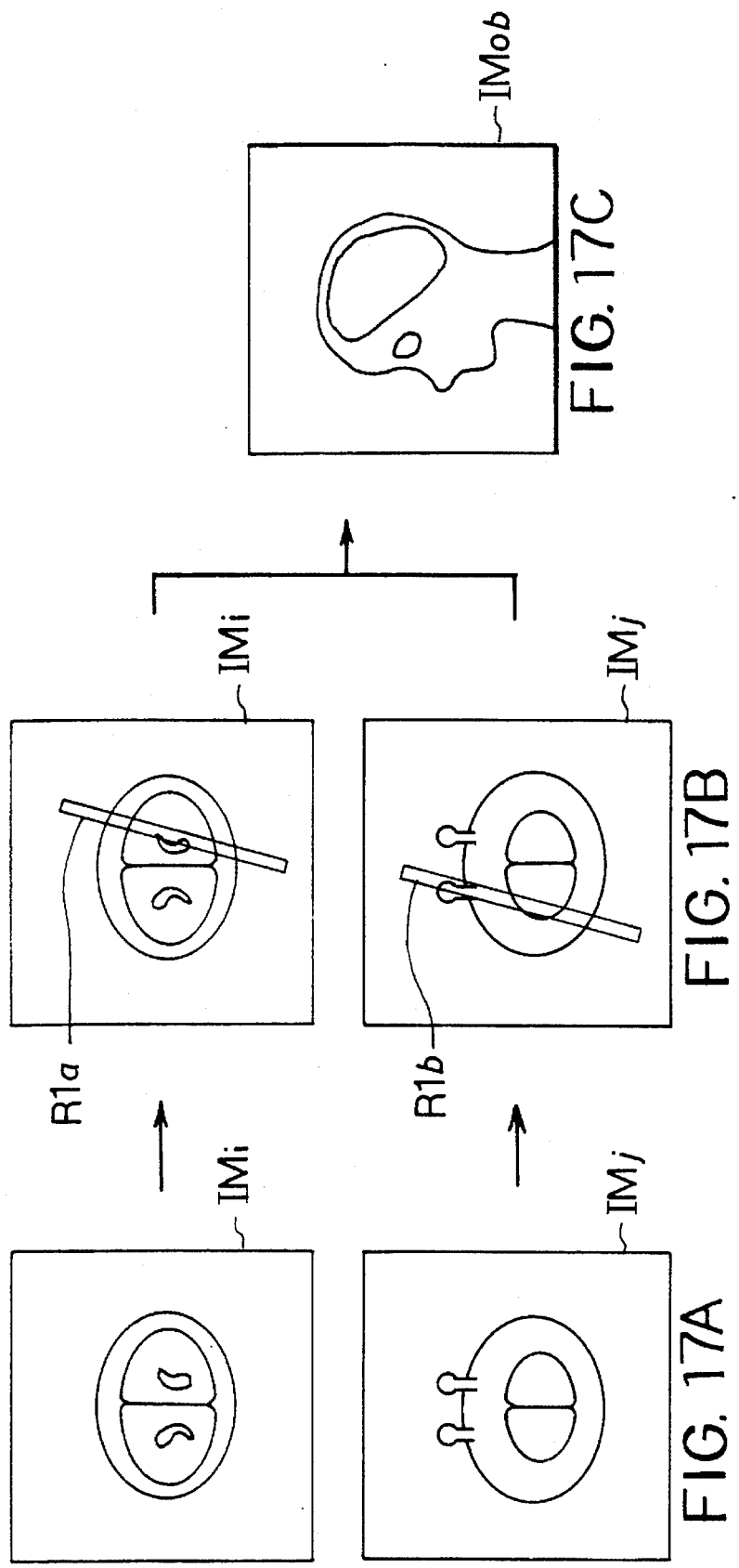
FIGS. 17A to 17C are illustrations explaining changes in images displayed in the fifth embodiment.

FIG. 16 shows a procedure from positioning to scanning in the fifth embodiment carried out by the main controller 10. At Step 90 in FIG. 16, a three-dimensional image data of a lesion is collected. Then at Step 91, among a plurality of tomographic images IM1 to IMn composing a three-dimensional image data, two desired tomographic image IMi and IMj are designated as two pilot images. For example, the two pilot images IMi and IMj are the images at the front and back of the three-dimensional image data.

The two pilot images IMi and IMj thus designated are displayed, as shown in FIG. 17A. At Step 93, it is judged if these pilot images IMi and IMj are acceptable.

After the pilot images IMi and IMj have been confirmed, at Step 94, two elongated rectangular ROIs R1*a* and R1*b* are placed on them, respectively, as shown in FIG. 17B. At this time, the two ROIs R1a and R1b are placed in parallel to each other. Then at Step 95, image data of a cross-section passing through the two ROIs R1a and R1b are edited from the three-dimensional image data. Further, at Step 96, the image data thus-edited are displayed as a prediction image IMob, as shown in FIG. 17C.

Then Steps 97 to 99 are processed in the same way.

This embodiment is able to predict an arbitrary oblique tomographic image, except that images in the same direction as the pilot images. Moreover, as the pilot image is increased in number than the fourth embodiment, more information of tomographic images is obtained with simplified one-stage processing, leading to more precise positioning.

A sixth embodiment of the present invention will now be described according to FIGS. 18 and 19.

The sixth embodiment relates to collection of voxel data in spectroscopy. A data collection by local excitation in spectroscopy have been done using an ISIS (image-selected in vivospectroscopy) method, for instance. This data collection adopts a positioning technique in which one pilot image is prepared and a rectangular ROI is placed on the pilot image for specifying a two-dimensional collection area. In addition to the collection area, under a conventional manner, a collection range in the depth direction of a lesion was given by manual operation. These collection area and range determines a three-dimensional voxel size for excitation.

In the above conventional manner, the collection range in the depth direction relied largely upon the sense of an operator. This sometimes resulted in the exclusion of a necessary important part of a lesion or the inclusion of a unnecessary part of it. That is, it is difficult to adequately determine the voxel size, thus often leading to recollection and increased collection time as a whole.

Figure 18:
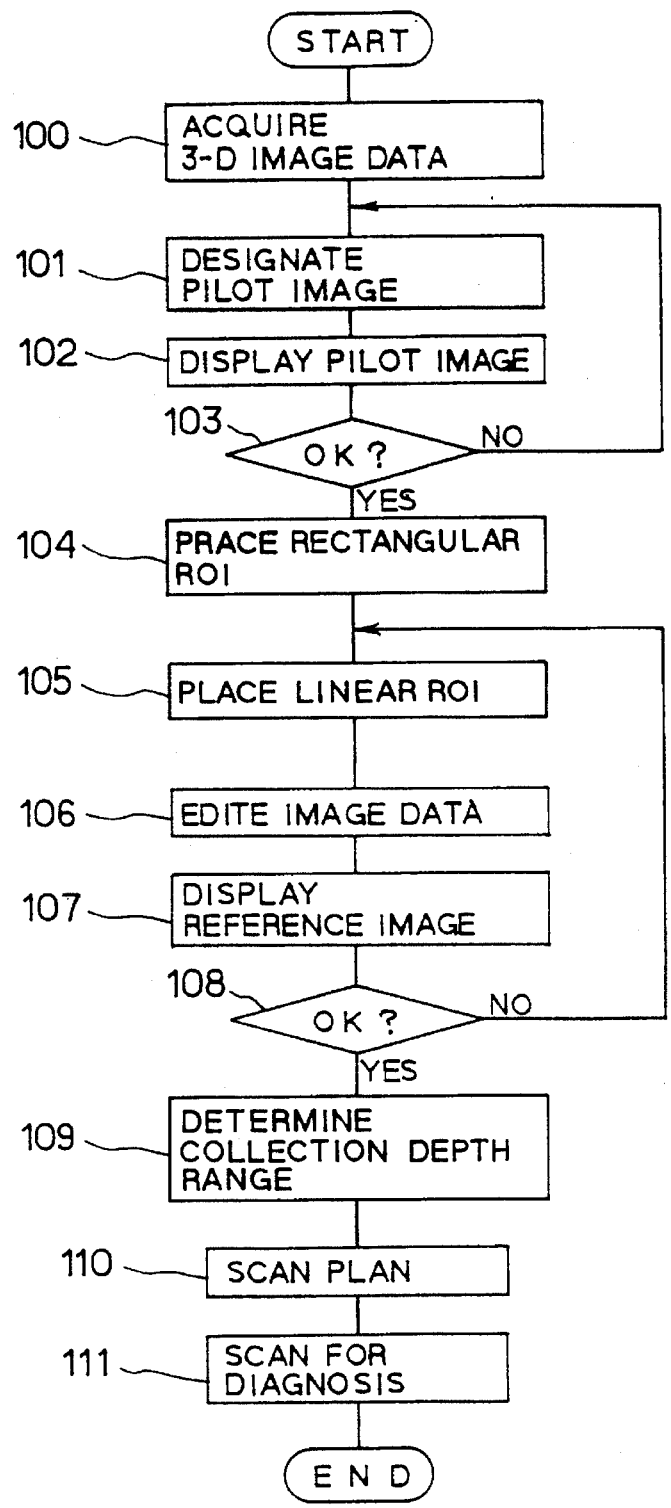
FIG. 18 is a flowchart explaining the positioning procedure in a sixth embodiment.

FIG. 18 shows a procedure from positioning to scanning in the sixth embodiment carried out by the main controller 10.

Steps 100 to 103 in FIG. 18 are the same as the aforementioned embodiments, with the result that one pilot image IMi (e.g. an axial image of a head) is displayed as in FIG. 19A.

The pilot image IMi is confirmed at Step 103. Then at Step 104, a rectangular ROI Rrec is placed on the pilot image IMi, as shown in FIG. 19B, for specifying a two-dimensional collection area.

Figure 1:
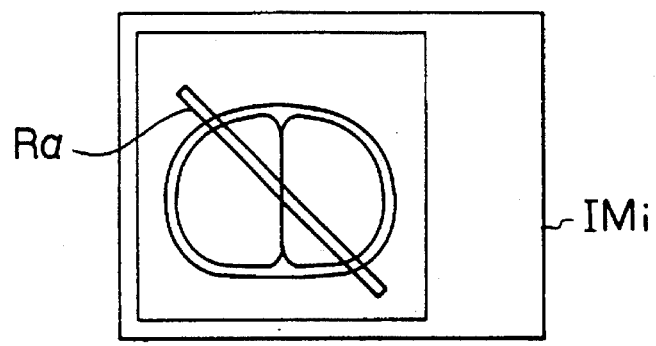
FIG. 1 is a view on a display explaining a prior positioning technique with one pilot image.
Figure 2:
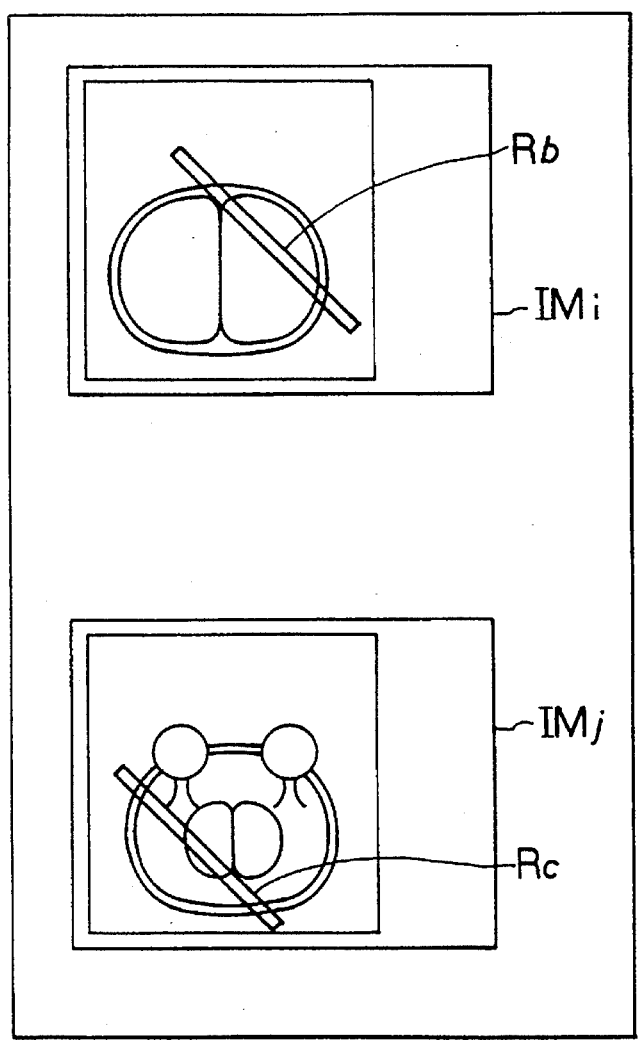
FIG. 2 is a view on a display explaining a prior positioning technique with two pilot images.

Further at Step 105, a linear ROI Rn, such as a line ROI and an elongated rectangular ROI, is placed in a manner that it passes the rectangular ROI Rrec (refer to FIG. 19C-1 or 19C-2). The linear ROI Rn may be set in any direction. Then at Step 106, image data of a cross-section passing the linear ROI Rn and being perpendicular to the pilot image IMi are edited as well, and at Step 107, the image data edited is displayed as a reference image IMtm, as shown in FIG. 19D-1 or 19D-2).

At Step 108, it is judged if the reference image IMtm is desired one. When NO (not desired image), the processing will go back to Step 105. In contrast, when YES (desired image), Step 109 is processed, in which two ROIs are used to specify a collection range in the depth direction on the reference image IMtm. For the specification, for example, two line ROIs Rm1 and Rm2 can be used to limit the collection range to a certain and appropriate one as shown in FIG. 19E-1 or two point ROIs Rs1 and Rs2 can also be used as shown in FIG. 19E-2.

Using the collection area and range thus-specified, a scan plan is done at Step 110. And at Step 111, data collection by local excitation is carried out, for instance, with an ISIS method.

As apparent from the above, the present invention can be applied to the data collection by local excitation in spectroscopy, preventing the collection range in the depth direction from being specified by the sense of an operator. This surely leads to more precise and proper determination of the voxel size. As a result, the present embodiment is effective in avoiding useless repeat of scans and excessive collection time.

What we claim is:

1. A method of magnetic resonance imaging in which positioning for a diagnostic scan is carried out prior to the diagnostic scan to obtain a magnetic resonance image of an object being examined, the method comprising the steps of:

preparing a three-dimensional image data consisting of a plurality of tomographic image data of a diagnostic portion of the object;

designating data of a tomographic image among the three-dimensional image data as data of a pilot image;

displaying the pilot image;

placing a linear region of interest on the displayed pilot image;

editing image data of a cross-section from the three-dimensional image data, the cross-section passing through the linear region of interest in a space of the three-dimensional image data;

displaying the edited image data as a prediction image representing the magnetic resonance image positionally obtainable when carrying out the diagnostic scan; and judging whether or not said prediction image is desired in response to a signal manually supplied for the prediction image.

2. The method according to claim 1, further comprising the steps of:

performing a scan plan for the diagnostic scan on the basis of said prediction image, when the prediction image is desired; and performing said diagnostic scan in accordance with the scan plan.

3. A method of magnetic resonance imaging in which positioning for a diagnostic scan is carried out prior to the diagnostic scan to obtain a magnetic resonance image of an object being examined, the method comprising the steps of:

preparing a three-dimensional image data consisting of a plurality of tomographic image data of a diagnostic portion of the object;

designating data of a tomographic image among the three-dimensional image data as data of a pilot image;

displaying the pilot image;

placing a first linear region of interest on the displayed pilot image;

editing image data of a first cross-section from the three-dimensional image data, the first cross-section passing through the first linear region of interest and being perpendicular to the pilot image in a space of the three-dimensional image data;

displaying the edited image data along the first cross-section as a reference image;

placing a second linear region of interest on the displayed reference image;

editing image data of a second cross-section from the three-dimensional image data, the second cross-section passing through the second linear region of interest in a space of the three-dimensional image data; and displaying the edited image data along the second cross-section as a prediction image representing the magnetic resonance image positionally obtainable when carrying out the diagnostic scan.

4. The method according to claim 3, wherein said pilot image consists of one image.

5. The method according to claim 4, wherein said reference image consists of one image and said first and second linear regions of interest consist of one region of interest, respectively.

6. The method according to claim 4, wherein said reference image consists of two images, said first linear region of interest consists of two regions of interest placed on the one pilot image, and said second linear region of interest consists of two regions of interest placed on the two reference images, respectively.

7. The method according to claim 6, wherein said two first linear regions of interest are parallel to each other on the pilot image and said two second linear regions of interest are parallel to each other over the two reference images.

8. The method according to claim 6, wherein said step of editing image data of a second cross-section further includes a step of judging whether or not the second cross-section is twisted and a step of stopping the editing of the image data when the second cross-section is twisted.

9. The method according to claim 8, further comprising the step of judging whether or not said prediction image is desired in response to a signal manually supplied for the prediction image.

10. The method according to claim 9, further comprising the steps of:

performing a scan plan for the diagnostic scan on the basis of said prediction image, when the prediction image is desired; and performing said diagnostic scan in accordance with the scan plan.

11. A method of magnetic resonance imaging in which positioning for a diagnostic scan is carried out prior to the diagnostic scan to obtain a magnetic resonance image of an object being examined, the method comprising the steps of:

preparing a three-dimensional image data consisting of a plurality of tomographic image data of a diagnostic portion of the object;

designating data of a tomographic image among the three-dimensional image data as data of a pilot image;

displaying the pilot image;

placing a two-dimensional data collecting area on the displayed pilot image;

placing a linear region of interest on the displayed pilot image, the linear region of interest passing through the two-dimensional data collecting area;

editing image data of a cross-section from the three-dimensional image data, the cross-section passing through the linear region of interest and being perpendicular to the pilot image in a space of the three-dimensional image data;

displaying the edited image data along the cross-section as a reference image; and specifying a one-dimensional data collecting range on the displayed reference image, the one-dimensional data collecting range, together with the two-dimensional data collecting area, determining a three-dimensional voxel size for local excitation in spectroscopy.

12. A system for magnetic resonance imaging in which positioning for a diagnostic scan is carried out prior to the diagnostic scan to obtain a magnetic resonance image of an object being examined, the system comprising:

means for preparing a three-dimensional image data consisting of a plurality of tomographic image data of a diagnostic portion of the object;

means for designating data of a tomographic image among the three-dimensional image data as data of a pilot image;

means for displaying the pilot image;

means for placing a linear region of interest on the displayed pilot image;

means for editing image data of a cross-section from the three-dimensional image data, the cross-section passing through the linear region of interest in a space of the three-dimensional image data;

means for displaying the edited image data as a prediction image representing the magnetic resonance image positionally obtainable when carrying out the diagnostic scan; and means for judging whether or not said prediction image is desired in response to a signal manually supplied for the prediction image.

13. The system according to claim 12, further comprising:

means for performing a scan plan for the diagnostic scan on the basis of said prediction image, when the prediction image is desired; and means for performing said diagnostic scan in accordance with the scan plan.

14. A system for magnetic resonance imaging in which positioning for a diagnostic scan is carried out prior to the diagnostic scan to obtain a magnetic resonance image of an object being examined, the system comprising:

means for preparing a three-dimensional image data consisting of a plurality of tomographic image data of a diagnostic portion of the object;

means for designating data of a tomographic image among the three-dimensional image data as data of a pilot image;

means for displaying the pilot image;

means for placing a first linear region of interest on the displayed pilot image;

means for editing image data of a first cross-section from the three-dimensional image data, the first cross-section passing through the first linear region of interest and being perpendicular to the pilot image in a space of the three-dimensional image data;

means for displaying the edited image data along the first cross-section as a reference image;

means for placing a second linear region of interest on the displayed reference image;

means for editing image data of a second cross-section from the three-dimensional image data, the second cross-section passing through the second linear region of interest in a space of the three-dimensional image data; and means for displaying the edited image data along the second cross-section as a prediction image representing the magnetic resonance image positionally obtainable when carrying out the diagnostic scan.

15. The system according to claim 14, wherein said pilot image consists of one image.

16. The system according to claim 15, wherein said reference image consists of one image and said first and second linear regions of interest consist of one region of interest, respectively.

17. The system according to claim 15, wherein said reference image consists of two images, said first linear region of interest consists of two regions of interest placed on the pilot image, and said second linear region of interest consist of two regions of interest placed on the two reference images, respectively.

18. The system according to claim 17, wherein said means for editing image data of the second cross-section includes means for judging whether or not the second cross-section is twisted, and means for stopping the editing of the image data when the second cross-section is twisted.

19. The system according to claim 18, further comprising means for judging whether or not said prediction image is desired in response to a signal manually supplied for the prediction image.

20. The system according to claim 19, further comprising:
- means for performing a scan plan for the diagnostic scan on the basis of said prediction image, when the prediction image is desired; and
- means for performing said diagnostic scan in accordance with the scan plan.

* * * * *